United States Patent
Egedal et al.

(10) Patent No.: US 10,352,973 B2
(45) Date of Patent: Jul. 16, 2019

(54) METHOD OF COMPUTER-ASSISTED DETERMINATION OF THE USAGE OF ELECTRICAL ENERGY PRODUCED BY A POWER GENERATION PLANT, PARTICULARLY A RENEWABLE POWER GENERATION PLANT

(71) Applicants: Per Egedal, Herning (DK); Ralph Grothmann, München (DE); Thomas Runkler, München (DE); Volkmar Sterzing, Neubiberg (DE)

(72) Inventors: Per Egedal, Herning (DK); Ralph Grothmann, München (DE); Thomas Runkler, München (DE); Volkmar Sterzing, Neubiberg (DE)

(73) Assignee: Siemens Aktiengesellschaft, Munich (DE)

( * ) Notice: Subject to any disclaimer, the term of this patent is extended or adjusted under 35 U.S.C. 154(b) by 880 days.

(21) Appl. No.: 14/367,914

(22) PCT Filed: Dec. 19, 2012

(86) PCT No.: PCT/EP2012/076136
§ 371 (c)(1),
(2) Date: Jun. 21, 2014

(87) PCT Pub. No.: WO2013/092702
PCT Pub. Date: Jun. 27, 2013

(65) Prior Publication Data
US 2015/0019276 A1  Jan. 15, 2015

(30) Foreign Application Priority Data
Dec. 21, 2011  (EP) .................................. 11194933

(51) Int. Cl.
*G06N 3/02*  (2006.01)
*G06Q 50/06*  (2012.01)
(Continued)

(52) U.S. Cl.
CPC ........... *G01R 21/1333* (2013.01); *G06N 3/02* (2013.01); *G06N 3/0454* (2013.01); *G06N 7/005* (2013.01);
(Continued)

(58) Field of Classification Search
CPC ...... G06Q 10/04; G06Q 50/06; G05B 13/027; G05B 2219/33025; G06N 3/08; G06N 3/02; Y02E 10/723
(Continued)

(56) References Cited

U.S. PATENT DOCUMENTS 5,023,045 A * 6/1991 Watanabe ................ G21D 3/04
376/215
5,467,235 A * 11/1995 Watanabe .......... G11B 17/0405
360/99.02
(Continued)

FOREIGN PATENT DOCUMENTS

CN  101737257 A  6/2010
CN  102147839 A  8/2011
(Continued)

OTHER PUBLICATIONS

Qudaih, Yaser Soliman and Mitani, Yasunori, "Power Distribution System polanning for Smart Grid Applications using ANN," ICSGCE 2011: Sep. 27-30, 2011, Chegdu, China.*
(Continued)

*Primary Examiner* — Renae Feacher
(74) *Attorney, Agent, or Firm* — Lempia Summerfield Katz LLC

(57) ABSTRACT

A method for computer-assisted determination of usage of electrical energy produced by a power generation plant such
(Continued)

as a renewable power generation plant is provided. The method uses a plurality of neural networks having a different structure or being learned differently for calculating future energy amounts produced by a power generation plant. To do so, the energy outputs of the power generation plant forecasted by the plurality of the neural networks are used to build histograms. Based on the histograms, energy amounts for different confidence levels describing the likelihood of the availability of the energy amount are determined, and different uses are assigned to different energy amounts. Energy amounts having a higher likelihood of availability in the future are sold at higher prices than other energy amounts.

21 Claims, 3 Drawing Sheets

(51) Int. Cl.
  *G01R 21/133* (2006.01)
  *G06N 3/04* (2006.01)
  *H02J 3/38* (2006.01)
  *G06N 7/00* (2006.01)
  *H02J 3/00* (2006.01)

(52) U.S. Cl.
  CPC .............. *G06Q 50/06* (2013.01); *H02J 3/383* (2013.01); *H02J 3/386* (2013.01); *H02J 2003/003* (2013.01); *Y02E 10/563* (2013.01); *Y02E 10/763* (2013.01)

(58) Field of Classification Search
  USPC ........................................................ 705/7.12
  See application file for complete search history.

(56) References Cited

U.S. PATENT DOCUMENTS

| | | | | |
|---|---|---|---|---|
| 5,467,265 | A * | 11/1995 | Yamada | F01K 13/02 700/276 |
| 6,975,925 | B1 | 12/2005 | Barnes et al. | |
| 7,464,061 | B2 * | 12/2008 | Grothmann | G05B 13/027 706/15 |
| 8,566,264 | B2 | 10/2013 | Schafer et al. | |
| 8,587,140 | B2 | 11/2013 | Egedal et al. | |
| 2002/0084655 | A1 * | 7/2002 | Lof | F03D 7/0284 290/44 |
| 2002/0087234 | A1 | 7/2002 | Lof | |
| 2003/0182250 | A1 | 9/2003 | Shihidehpour et al. | |
| 2007/0031237 | A1 * | 2/2007 | Bonnet | F03D 7/0296 415/1 |
| 2007/0255461 | A1 * | 11/2007 | Brickfield | H02J 3/008 700/295 |
| 2008/0195255 | A1 | 8/2008 | Lutze | |
| 2008/0319724 | A1 * | 12/2008 | Domijan, Jr. | G01W 1/06 703/2 |
| 2010/0049339 | A1 * | 2/2010 | Schafer | G05B 13/027 700/31 |
| 2010/0127495 | A1 | 5/2010 | Egedal et al. | |
| 2012/0150361 | A1 * | 6/2012 | Lazaris | H02J 3/382 700/297 |

FOREIGN PATENT DOCUMENTS

| | | |
|---|---|---|
| DE | 102007001026 B4 | 9/2008 |
| DE | 102011081197 A1 | 2/2013 |

OTHER PUBLICATIONS

Cali et al., "Artificial neural network based wind power forecasting using a multi-model approach," 7th International Workshop on Large Scale Integration of Wind Power and on transmission Networks for Offshore Wind Farms, Jan. 2008.*
"Sustainable Power Generation a Better Forecast for Renewable Energy Generation," Siemens, Pictures of the Future, Apr. 1, 2014.*
Catalao et al., "An artificial neural network approach for short term electricity prices forecasting," Eng Int Syst (2001) : 15-23.*
Chinese office Action for related Chinese Application No. 201280070293.X dated Apr. 1, 2016 with English Translation.
Arthur F. Pease; The Science of Prediction; Pictures of the Future—Fall 2011, pp. 53-56; retrieved from the Internet: URL:www.siemens.com/innovation/pool/en/publikationen/publications_pof/pof_fall_2011/machine_learning/pof0211_ml_prognosen_en.pdf; retrieved on Apr. 17, 2012; Jan. 1, 2011.
Beuthner Andreas; Optimizing Energy and Water supply networks; pp. 102-104; Picture of the future Spring 2008; Jan. 1, 2008.
Cali UE. et. al.; Artificial neural network based wind power forecating using a multi-model approach; pp. 1-6; http://www.hrensemble.net/public/pdf; 7th International workshop on large scale Integration of wind power and on transmission networks for offshore wind farms; May 1, 2008
European search report for European Application No. EP11194933.5, dated Nov. 20, 2014.
European Search Report Application No. EP11194933.5 dated May 2, 2012.
International Search Report and Written Opinion in corresponding PCT Application No. PCT/EP2012/076136, dated Feb. 14, 2013.
Salcedo-Sanz, S. et al: Accurate short-term wind speed prediction by exploiting diversity in input data using banks of artificial neural networks, Neurocomputing, Elsevier Science Publishers, vol. 72, No. 4-6, pp. 1336-1341, 2009, Jan. 1, 2009.
Yaser Soliman Qudaih et al: Power Distribution System Planning for Smart Grid Applications using ANN, Energy Procedia, vol. 12, pp. 3-9; ISSN: 1876-6102; DOI 10.1016/j.egypro.2011.10.003; Jan. 1, 2011.
Zheng Z. W. et. al.; An Overview: the development of Prediction Technology of Wind and Photovoltaic Power Generation; pp. 601-608; ISSN:1876-6102; DOI: 10.1016/j.egypro.2011.10.081; Energy Procedia; Jan. 1, 2011.
India Examination Report for India Patent Application No. 4876/DELNP/2014 dated Nov. 29, 2018, with English translation.

* cited by examiner

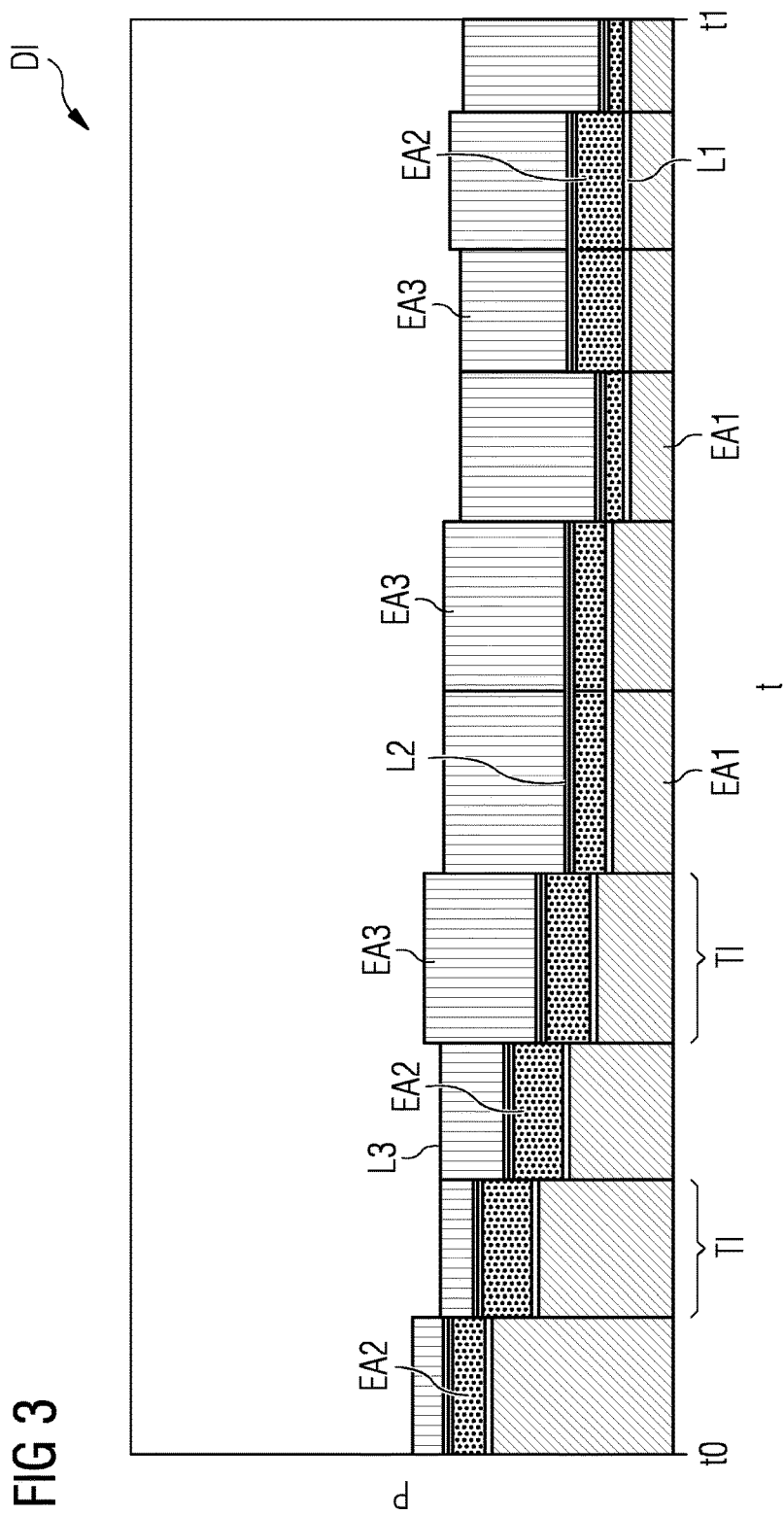

METHOD OF COMPUTER-ASSISTED DETERMINATION OF THE USAGE OF ELECTRICAL ENERGY PRODUCED BY A POWER GENERATION PLANT, PARTICULARLY A RENEWABLE POWER GENERATION PLANT

This application is the National Stage of International Application No. PCT/EP2012/076136, filed Dec. 19, 2012, which claims the benefit of European Patent Application No. EP 11194933.5, filed Dec. 21, 2011. The entire contents of these documents are hereby incorporated herein by reference.

BACKGROUND

The present embodiments relate to computer-assisted determination of usage of electrical energy produced by a power generation plant.

The energy produced by power generation plants and, for example, renewable power generation plants may vary so that no ensured energy availability may be given. With respect to renewable power generation plants, this variation is caused due to different environmental conditions (e.g., different wind speeds or wind directions for wind power generation plants or changing solar radiations for solar power generation plants). Due to this fact, fluctuating energy infeeds from renewable energy sources are accepted in some countries only if those infeeds do not pose safety concerns for the energy transmission network.

It is known from the prior art to use weather forecasts in order to determine predictions for the energy produced in the future by a renewable power generation plant. These predictions are considered in the planning of fossil energy load curves. However, the energy produced in future time intervals by renewable power plants is not categorized in order to be used for different purposes.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a computer-assisted method in order to predict a future energy produced by a power generation plant such that energy amounts for appropriate uses are specified is provided.

According to the method, a plurality of neural networks learned by training data is provided. Each neural network includes an input layer of neurons for describing inputs affecting the energy produced by the plant, one or more hidden layers of neurons and an output layer of neurons for describing energy outputs of the plant. The energy outputs include future energy outputs for a plurality of points in time within a future time period, where each neural network of the plurality of networks has a different structure and/or is learned differently. Hence, an ensemble of neural networks is processed in the method. The above term "energy output" as well as the term "energy level" mentioned below are to be interpreted broadly. These terms may refer to a particular energy produced in an interval of time but may also refer to an electrical power (e.g., energy per time). For example, an energy output may correspond to the electrical power (in Watts) produced at a particular point of time. Alternatively, the energy output may refer to the electrical energy (e.g., in Joules or Multiples of Ws such as MWh) produced between subsequent points in time.

According to one or more of the present embodiments, the future energy outputs for the plurality of points in time are forecasted by each neural network. Based on these forecasts, one or more histograms of future energy outputs are calculated. Each histogram represents the distribution and thus the likelihood of future energy outputs forecasted by the plurality of neural networks for points in time in a corresponding time interval including one or more subsequent points in time. Hence, the future time period is divided in several future time intervals, where for each future time interval, a corresponding histogram based on the forecasts of the neural networks is calculated.

In the next act, one or more energy levels for each time interval are determined, where each energy level is derived from a confidence level of a number of confidence levels. Each confidence level represents a percentage of the future energy outputs in the corresponding histogram, where each future energy output within this percentage has the same or a greater value than the energy level being derived for the corresponding confidence level.

In a next act, predetermined uses are assigned to energy amounts according to each energy level in the respective time intervals, where an energy amount according to an energy level represents the energy between the energy level and the next lower energy level. If the energy level is the lowest energy level, the next lower energy level corresponds to an energy of zero.

One or more of the present embodiments are based on the understanding that, by using a plurality of different neural networks, corresponding histograms that enable the determination of energy amounts differing in the likelihood that the energy amount will be available may be calculated. The energy amounts may be assigned to appropriate uses.

The plurality of neural networks used for forecasting may include one or more recurrent neural networks (e.g., time delay recurrent neural networks unfolded in time), such as the recurrent neural network disclosed in document DE 10 2007 001 026 B4. The whole disclosure of this document is incorporated by reference in this application. Instead or as an alternative, the plurality of neural networks may include one or more feed forward networks and/or one or more networks embedding at least one feed forward network into at least one recurrent neural network.

The method according to one or more of the present embodiments has particular advantages in case that the power generation plant is a renewable power generation plant (e.g., a wind power generation plant including a number of wind turbines and/or a solar power generation plant including a number of solar panels). This is because the energy produced by these plants is strongly fluctuating.

In one embodiment, the confidence levels used in the method includes one or more first confidence levels, where the use of the energy amount according to the energy level corresponding to a first confidence level is such that the part of the corresponding energy amount not yet sold to third parties or not yet reserved otherwise is offered as consumable energy at a predetermined price per unit to third parties, where the predetermined price per unit increases with an increasing percentage of the future energy outputs represented by the first confidence level.

In another embodiment, the energy amounts offered to third parties are traded on an energy trading platform (e.g., on an electricity exchange, such as the German EEX or comparable systems, such as smart grids).

In another embodiment, the inputs of each neural network include data concerning the environment of the power generation plant and/or one or more characteristics of the power generation plant (e.g., weather data at a plurality of positions in the environment of the power generation plant and/or geographic data concerning the location of the power generation plant). All the parameters may have an influence on the energy output of the plant. The inputs of each neural network may include data (e.g., weather data) measured at past points in time and/or predicted for future points in time (e.g., based on weather forecasts that may be provided by a meteorological service).

The weather data may include temperature values and/or atmospheric pressure values and/or atmospheric humidity values and/or wind speeds and/or wind directions and/or turbulence values and/or parameters concerning the solar radiation. Parameters concerning the wind speeds and wind directions are, for example, important for power generation plants in the form of wind power generation plants. Contrary to that, parameters concerning the solar radiation are important, for example, for solar power generation plants. This data may refer to the coverage of the sky by clouds or the intensity of the solar radiation. The above mentioned geographic data may refer to the landscape around the power generation plant that may have an influence on the generated energy. For example, in case that a forest is located near the wind turbines or in case that wind turbines are positioned in a valley, the energy output is lower than for wind turbines on a hill or surrounded by water.

In another embodiment, the confidence levels include second confidence levels representing, for example, a lower percentage than the first confidence levels, where the use of the energy amount according to the energy level corresponding to the second confidence level includes one of the following uses: offering the part of the corresponding energy amount not yet sold to third parties or not yet reserved otherwise as control energy to third parties, where control energy, contrary to the consumable energy, is only used as a reserve energy for short-term or medium-term fluctuations in the energy production of an energy grid; refraining from offering the part of the corresponding energy amount not yet sold to third parties or not yet reserved otherwise to third parties and optionally reserving this part of the energy amount for prolongating the lifetime of the power generation plant and/or reducing the noise emissions of the power generation plant and/or performing maintenance work at the power generation plant.

In case the energy amount is used for lifetime prolongation or noise reduction, the energy output of the plant may be reduced by this energy amount (e.g., by reducing the rotational speeds of wind turbines), resulting in a longer lifetime and lower noise emissions. In case that the energy amount is used for maintenance work, the energy produced by the plant may be reduced by this energy amount in order to stop some wind turbines in a wind power generation plant for performing maintenance work on those turbines.

In another embodiment, at least one feed forward network includes a plurality of hidden layers, each hidden layer being coupled to a separate output cluster. The input layer of this feed forward network may be coupled to each hidden layer. For example, the neural feed forward network described in German patent application DE 10 2011 081 197.4 may be used in the method. The whole disclosure of this German patent application is incorporated by reference in this application.

In another variant of the method, each neural network of the plurality of neural networks is learned with different training data and/or different learning parameters and/or is initialized differently. Hence, the neural networks may have the same structure but differ in other features concerning the learning phase.

In another embodiment, the confidence levels are adapted based on a comparison between the actual energy outputs and the corresponding energy outputs having been forecasted by each neural network. Hence, an appropriate recalibration of the statistical model considering the actual produced energy outputs may be performed.

Besides the above described method, a computer program product including program code stored on a computer readable medium (e.g., a non-transitory computer-readable storage medium) for performing the method when the program is run on a computer. A computer program stored on a non-transitory computer-readable storage medium and including a program code for performing the method when the program code is run on a computer is also provided.

BRIEF DESCRIPTION OF THE DRAWINGS

FIG. 3 shows a diagram illustrating energy amounts used differently according to one embodiment.

DETAILED DESCRIPTION

In the following, the present embodiments will be described with respect to a renewable power generation plant in the form of a wind park including a plurality of wind turbines. However, the present embodiments may also be applied to other power generation plants and renewable power generation plants (e.g., for solar power generation plants including a corresponding number of solar panels).

The problem of renewable energies resides in the fact that the amount of produced energy is strongly depending on the environmental conditions around the plant. For wind farms, the wind speed and the wind direction are the main factors having influence of the energy production. According to one or more of the present embodiments described in the following, an appropriate forecast of future energy amounts produced by the plant is given in combination with confidence levels. A confidence level corresponds to the likelihood that the energy amount will be available in the future and, based on this level, the corresponding energy amount may be offered at different prices to third parties (e.g. via an energy trading platform).

In order to determine energy levels representing predetermined confidence levels for future energy amounts, one or more of the present embodiments described in the following use an ensemble of a plurality of neural networks where each neural network is structured and/or trained differently and provides corresponding forecasts of future energy outputs of the wind farm. In the following, those energy outputs correspond to electrical power values provided by the plant for corresponding points in time within a future time period.

Figure 1:
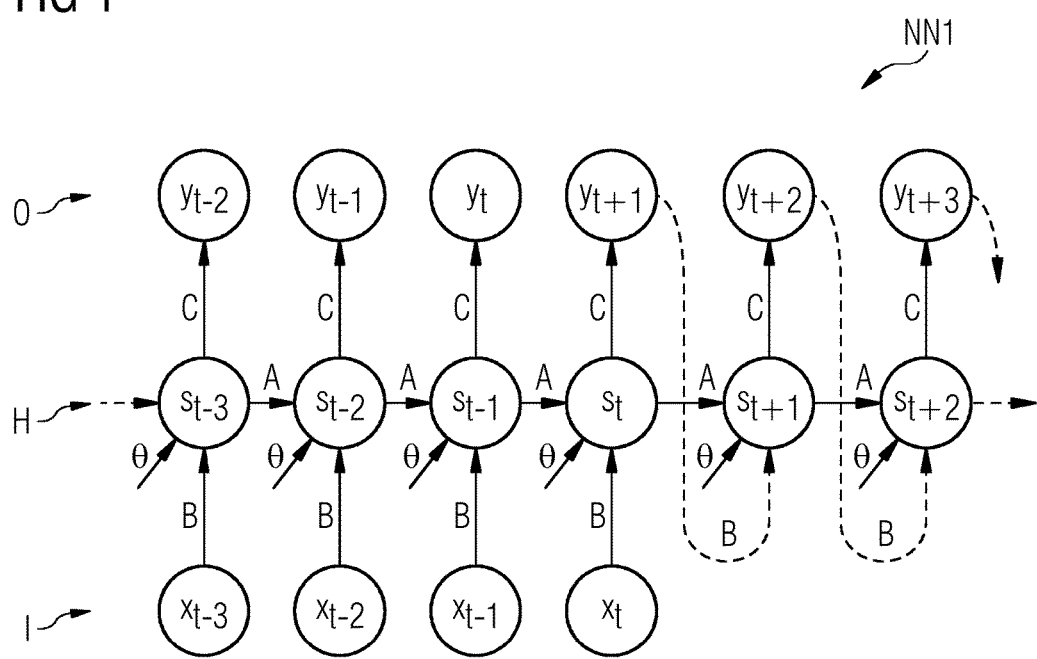
FIG. 1 shows a recurrent neural network that may be used in one embodiment in order to forecast energy outputs of a power generation plant.
Figure 2:
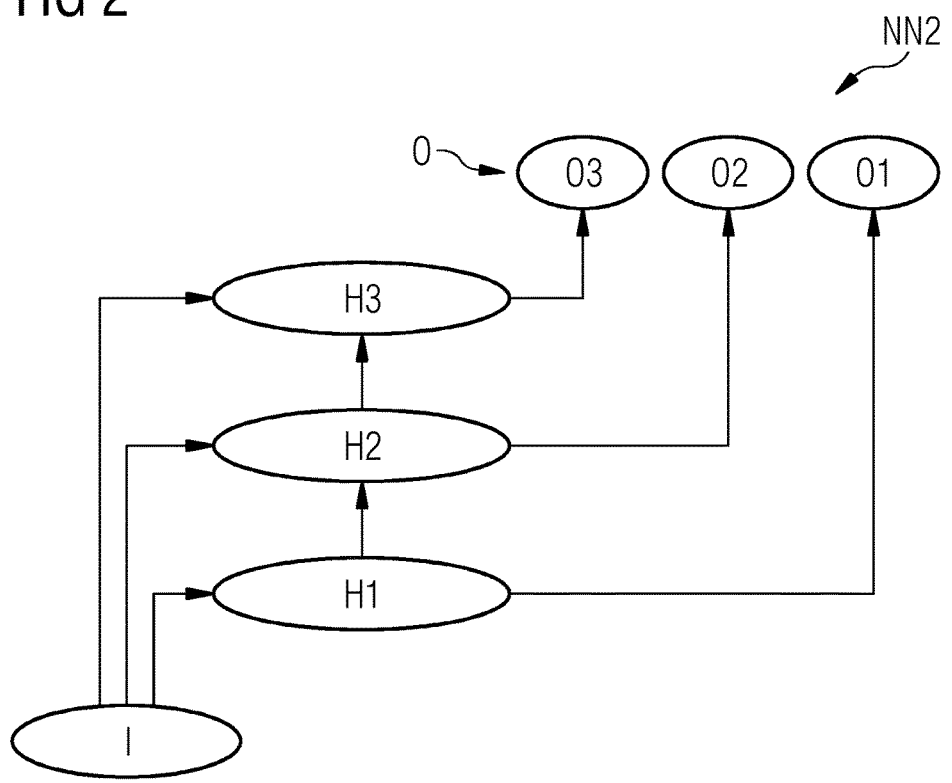
FIG. 2 shows a feed forward neural network that may be used in another embodiment for forecasting energy outputs of a power generation plant.

FIG. 1 and FIG. 2 show neural networks that may be used in the ensemble of neural networks. The network of FIG. 1 is a time delay recurrent neural network NN1 that is unfolded in time to capture the system's memory plus a forecast horizon for which the future energy outputs are determined. The points in time for which future energy outputs are determined may be based on hourly intervals, where the forecast horizon may include a number of days or even weeks.

The network shown in FIG. 1 has the same structure as the network disclosed in document DE 10 2007 001 026 B1. The network includes an input layer I, a recurrent hidden layer H, and an output layer O. The input layer includes a plurality of measured inputs $x_{t-3}$, $x_{t-2}$, $x_{t-1}$, $x_t$ forming input vectors having influence on the energy output of the wind farm. For example, the inputs include grid weather data including weather parameters in a plurality of horizontal and vertical locations within the environment of the wind farm. The grid weather data includes, for example, temperature values and/or atmospheric pressure values and/or wind speed and/or wind directions and/or turbulence values and/or atmospheric humidity values. In case that the plant is a solar power generation plant, the data may also include parameters concerning the solar radiation (e.g., the coverage of the heaven with clouds or the intensity of the solar radiation and the like).

In a variant of the network shown in FIG. 1, also grid weather data predicted by an appropriate model and, for example, provided by a meteorological service may be used as input data in FIG. 1. In such a variant, the input layer also includes inputs $x_{t+1}$, $x_{t+2}$, etc. for future time points t, t+1, etc. The input layer I is coupled via matrices B and an appropriate bias Θ with hidden recurrent neural clusters $s_{t-3}$, $s_{t-2}$, etc. in the hidden layer H. The hidden clusters are connected via matrices A. Each of the hidden neural clusters is connected to an output cluster $y_{t-2}$, $y_{t-1}$, etc. in the output layer O via matrices C. The output clusters form the above mentioned energy outputs that are predicted for future points in time t+1, t+2, etc. by the neural network.

FIG. 2 shows an embodiment of a feed forward neural network NN2 that may also be used in the ensemble of neural networks for forecasting energy outputs of a wind farm. The network corresponds to the network as described in the German patent application DE 10 2011 081 197.4. The network includes one input layer I, a plurality of hidden layers H1, H2 and H3, and an output layer O including a plurality of output clusters O1, O2 and O3. Analogously to FIG. 1, the input layer includes corresponding input vectors. In a variant of the network of FIG. 2, only future predicted input vectors (e.g., in the form of forecasted weather data) may be used. In the network shown in FIG. 2, the inputs of the input layer are fed to all intermediate hidden layers H1, H2 and H3 to avoid the loss of input information. Each hidden layer is connected to an output cluster (e.g., hidden layer H1 is connected to output cluster O1, hidden layer H2 is connected to output cluster O2 and hidden layer H3 is connected to output cluster O3). Analogously to FIG. 1, the output clusters shown in FIG. 2 represent corresponding future energy outputs of the wind farm predicted by the neural network. In the embodiment shown in FIG. 2, each output cluster represents the same future energy outputs. The final energy output determined for a corresponding point in time may be represented by the average value of the energy outputs of each output cluster.

When learning the network of FIG. 2, the learning is not only applied to the last output layer but also to the intermediate hidden layers. In a first stage of the network shown in FIG. 2 (e.g., hidden layer H1), the forecast of the energy output is only based on the input data of the input layer I. In a second stage (e.g., hidden layer H2), the network not only uses the external influences but also the processed input information from the previous stage (e.g., the information flow from the first hidden layer H1). The same applies to the hidden layer H3, which uses the processed information of the hidden layer H2 besides the input information from the input layer I.

In another embodiment, the ensemble of neural networks may include a combination of the recurrent neural network of FIG. 1 and the feed forward network of FIG. 2. Copies of the feed forward network of FIG. 2 may substitute in the network of FIG. 1 the coupling between the inputs and the hidden neural clusters via matrices B. For example, the output layer of network NN2 is used as a neural cluster in the hidden layer H. The matrix B of FIG. 1 is substituted by the structure of FIG. 2 coupling the input layer I with the output clusters O1 to O3. Each input vector $x_{t-3}$, $x_{t-2}$, etc. shown in FIG. 1 is substituted by the input layer I shown in FIG. 2. Also, other variants of neural networks may be used according to one or more of the present embodiments. However, the neural networks are to be structured and learned such that the neural networks may provide appropriate forecasts for a sequence of future energy outputs of a wind farm or another power generation plant. For example, the neural networks are learned by appropriate training data corresponding to known inputs and known energy outputs of the power generation plant.

One or more of the present embodiments use an ensemble of appropriately learned neural networks where each network of the ensemble differs from the other networks. For example, the networks may have different structures or may be learned or initialized differently. For example, the same structure may be used for all neural networks in the ensemble, but each neural network is learned with different training data and/or with different learning parameters. For example, the learning rates of the networks may be different. The networks may be initialized by different matrices (e.g., random matrices).

FIG. 3 shows a diagram DI illustrating the prediction of energy amounts for a forecast horizon according to one embodiment. The abscissa t of the diagram DI corresponds to a forecast horizon from the presence t0 to a future time point t1. In this time period, different energy amounts in the form of energy blocks EA1, EA2 and EA3 are calculated for corresponding time intervals TI. For clarity reasons, only some of the time intervals and only some of the energy blocks are designated by reference numerals. The energy amounts EA1 are indicated by obliquely hatched blocks, the energy amounts EA2 are indicated by dotted blocks, and the energy amounts EA3 are indicated by vertically hatched blocks. The upper bounds of the blocks EA1, EA2, and EA3 correspond to energy levels L1, L2 and L3, respectively. The energy levels L1, L2 and L3 correspond to particular levels of electrical power P according to the ordinate of the diagram DI. The calculation of this energy level will be described in the following.

For a plurality of different points in time within the time period between t0 and t1, the corresponding energy outputs of each of the neural networks in the ensemble of neural networks are calculated. The distance between subsequent points in time is smaller than the time interval TI (e.g., the time interval TI includes several points in time). For example, a time interval TI may refer to a time period of a day, whereas the difference between subsequent points in time may be a one hour interval. For all time points within a corresponding time interval TI, the histogram of the occurrences of the energy outputs forecasted by the plurality of neural networks is determined. Thereafter, the energy levels L1, L2 and L3 are derived for corresponding confidence levels. Each confidence level specifies a percentage of the energy outputs included in the histogram having a value equal or higher than the corresponding energy level to be determined. For example, based on a predetermined confidence threshold (e.g., 99%), the prediction of the energy outputs and confidence values indicate that the energy available in this time period is equal or greater than the energy level shown for this confidence on the Y axis.

The corresponding energy amounts EA1, EA2 and EA3 within a respective time interval TI are defined as follows. The energy amount EA1 refers to the cumulative energy represented by the area under the energy level L1 within a respective time interval TI. The energy amount EA2 refers to the cumulative energy between the energy level L2 and the energy level L1 within a respective time interval TI. The energy level EA3 refers to the cumulative energy between the energy level L3 and the energy level L2 within the time interval TI. The different energy blocks according to the different confidence levels have a different likelihood of availability. For example, the percentages assigned to the confidence levels decrease from the confidence level represented by the energy level L1 to the confidence level represented by the energy level L3. In the embodiment shown in FIG. 3, the confidence level referring to energy level L1 refers to an energy amount being available for sure (e.g., to a base load comparable energy amount). This may correspond to a percentage of, for example, 99%. The energy amount EA2 represents a lower percentage of, for example, 80% and refers to energy having a high likelihood to be available. Contrary to that, the energy amount EA3 refers to the lowest confidence level of, for example, 60% and corresponds to an energy block of fluctuating energy.

According to the future energy amounts for the different confidence levels, different uses for those amounts are defined. In the embodiment shown in FIG. 3, the uses refer to offering of the parts of the corresponding energy amounts not yet sold or not yet reserved otherwise as consumable energy to third parties (e.g., via an energy trading platform). The price per unit for the energy amount is decreasing from energy amount EA1 to energy amount EA3 within a time interval TI due to the fact that the likelihood that the energy will be available decreases. The prices per unit from one time interval to the next in the future for corresponding energy amounts will decrease because the reliability of the forecasts will decrease.

Besides the confidence level used in FIG. 3, further confidence levels may be defined. The corresponding energy amounts of the confidence levels may have other uses. For example, a confidence level for an energy amount to be used as control energy may be defined. This energy amount refers to a low confidence level such that the energy is not suitable to be sold as a consumable energy, but may be offered as a reserve energy for a grid operator in case of fluctuating power in the energy grid. The price per unit for this control energy is much lower than for directly consumable energy. An even lower confidence level may be defined for an energy amount not intended to be offered to third parties due to the high risk of unavailability. If desired, this energy amount may be used to reduce the noise emissions of the wind park and to prolongate the lifetime of the wind turbines or a wind park (e.g., by operating the wind turbines at lower rotational speeds). Furthermore, this energy may be used in order to perform maintenance work (e.g., some of the wind turbines in the wind park are stopped such that the energy production is reduced by this energy). Hence, maintenance works may be performed on the stopped wind turbines.

The present embodiments, as described in the following, have a number of advantages. For example, the forecasted amount of energy within a future time period may be categorized according to the likelihood that the energy will be available. According to the different categories, different uses are associated with the corresponding energy amounts. Base load comparable energy amounts being available for sure may be sold for premium prices. Energy amounts with a lower confidence level may be sold to reduced prices (e.g., as control energy) or may be used to reduce the lifetime consumption or the noise emissions of the power generation plant. The information about the future energy amounts according to the confidence levels may be offered to an energy grid operator for the planning of fossil power production curves.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for computer assisted determination of usage of electrical energy produced by a power generation plant, the method comprising:

provising a plurality of neural networks learned by training data, each neural network of the plurality of neural networks comprising an input layer of neurons for describing inputs affecting an energy produced by the power generation plant, one or more hidden layers of neurons and an output layer of neurons for describing energy outputs of the power generation plant, the energy outputs comprising future energy outputs for a plurality of points in time within a future time period, wherein each neural network of the plurality of neural networks has a different structure, is learned differently, or has the different structure and is learned differently;

forecasting the future energy outputs for the plurality of points in time by each neural network of the plurality of neural networks;

calculating one or more histograms of future energy outputs, each histogram of the one or more histograms representing a distribution of future energy outputs forecasted by the plurality of neural networks for points in time in a corresponding time interval comprising one or more subsequent points in time;

determining one or more energy levels for each time interval, wherein each energy level is derived from a confidence level of a number of confidence levels, each confidence level representing a percentage of the future energy outputs in the corresponding histogram, where each of the future energy outputs within the percentage has a same or a greater value than the energy level being derived for the corresponding confidence level;

assigning predetermined uses to energy amounts according to each energy level in each time interval, wherein an energy amount according to each energy level represents the energy between each energy level and a next lower energy level, respectively, within the respective time interval; and reducing, based on the confidence level and the predetermined use associated with the respective time interval, the energy output of the power generation plant by the respective energy amount for the respective time interval, wherein the energy output of the power generation plant is reduced by controlling operation of a wind turbine or a solar panel at the power generation plant.

2. The method of claim 1, wherein the plurality of neural networks comprises one or more recurrent neural networks, particularly time delay recurrent neural networks unfolded in time, and/or, one or more feed forward networks, one or more networks embedding at least one feed forward network into at least one recurrent neural network, or a combination thereof.

3. The method of claim 1, wherein the power generation plant includes a wind power plant comprising a number of wind turbines, a solar power plant comprising a number of solar panels, or the wind power plant and the solar power plant.

4. The method of claim 1, wherein the confidence levels comprise one or more first confidence levels, wherein the use of the energy amount according to the energy level corresponding to a first confidence level is such that a part of the energy amount not yet sold to third parties or not yet reserved otherwise is offered as consumable energy at a predetermined price per unit to third parties, wherein the predetermined price per unit increases with an increasing percentage of the future energy outputs represented by the first confidence level.

5. The method of claim 4, wherein the energy amounts offered to third parties are traded on an energy trading platform.

6. The method of claim 1, wherein the inputs of each neural network of the plurality of neural networks comprise data concerning an environment of the power generation plant, one or more characteristics of the power generation plant, or a combination thereof.

7. The method of claim 1, wherein the inputs of each neural network of the plurality of neural networks comprise data, measured at past points in time, predicted for future points in time, or measured at past points in time and predicted for future points in time.

8. The method of claim 6, wherein the data comprise temperature values, atmospheric pressure values, atmospheric humidity values, wind speeds, wind directions, turbulence values, parameters concerning the solar radiation, or any combination thereof.

9. The method of claim 4, wherein the confidence levels comprise one or more second confidence levels representing a lower percentage than the first confidence level, wherein the use of the energy amount according to the energy level corresponding to a second confidence level comprises one of the following uses:

offering the part of the energy amount not yet sold to third parties or not yet reserved otherwise as control energy to third parties; and refraining from offering the part of the energy amount not yet sold to third parties or not yet reserved otherwise to third parties and optionally reserving the part of the energy amount for prolongating the lifetime of the power generation plant, reducing noise emissions of the power generation plant, performing maintenance work at the power generation plant, or any combination thereof.

10. The method of claim 2, wherein the plurality of neural networks comprises the one or more feed forward networks, and wherein at least one feed forward network of the one or more feed forward networks comprises of plurality of hidden layers, each hidden layer of the plurality of hidden layers being coupled to a separate output cluster.

11. The method of claim 10, wherein the input layer of the at least one feed forward network is coupled to each hidden layer of the plurality of hidden layers.

12. The method of claim 1, wherein each neural network of the plurality of neural networks is learned with different training data, different learning parameters, or different training data and different learning parameters, is initialized differently for learning, or a combination thereof.

13. The method of claim 1, wherein the confidence levels are adapted based on a comparison between the actual energy outputs and the corresponding energy outputs having been forecasted by each neural network of the plurality of neural networks.

14. A computer program product comprising a program code stored on a non-transitory computer readable storage medium and executable by a computer for computer assisted determination of usage of electrical energy produced by a power generation plant, the program code including instructions, the instructions comprising:

providing a plurality of neural networks learned by training data, each neural network of the plurality of neural networks comprising an input layer of neurons for describing inputs affecting an energy produced by the power generation plant, one or more hidden layers of neurons and an output layer of neurons for describing energy outputs of the power generation plant, the energy outputs comprising future energy outputs for a plurality of points in time within a future time period, wherein each neural network of the plurality of neural networks has a different structure, is learned differently, or has the different structure and is learned differently;

forecasting the future energy outputs for the plurality of points in time by each neural network of the plurality of neural networks;

calculating one or more histograms of future energy outputs, each histogram of the one or more histograms representing a distribution of future energy outputs forecasted by the plurality of neural networks for points in time in a corresponding time interval comprising one or more subsequent points in time;

determining one or more energy levels for each time interval, wherein each energy level is derived from a confidence level of a number of confidence levels, each confidence level representing a percentage of the future energy outputs in the corresponding histogram, where each of the future energy outputs within the percentage has a same or a greater value than the energy level being derived for the corresponding confidence level;

assigning predetermined uses to energy amounts according to each energy level in each time interval, wherein an energy amount according to each energy level represents the energy between each energy level and a next lower energy level, respectively, within the respective time interval; and reducing, based on the confidence level and the predetermined use associated with the respective time interval, the energy output of the power generation plant by the respective energy amount for the respective time interval, wherein the energy output of the power generation plant is reduced by controlling operation of a wind turbine or a solar panel at the power generation plant.

15. In a non-transitory computer-readable storage medium that stores instructions executable by one or more processors for determination of usage of electrical energy produced by a power generation plant, the instructions comprising:

provariding a plurality of neural networks learned by training data, each neural network of the plurality of neural networks comprising an input layer of neurons for describing inputs affecting an energy produced by the power generation plant, one or more hidden layers of neurons and an output layer of neurons for describing energy outputs of the power generation plant, the energy outputs comprising future energy outputs for a plurality of points in time within a future time period, wherein each neural network of the plurality of neural networks has a different structure, is learned differently, or has the different structure and is learned differently;

forecasting the future energy outputs for the plurality of points in time by each neural network of the plurality of neural networks;

calculating one or more histograms of future energy outputs, each histogram of the one or more histograms representing a distribution of future energy outputs forecasted by the plurality of neural networks for points in time in a corresponding time interval comprising one or more subsequent points in time;

determining one or more energy levels for each time interval, wherein each energy level is derived from a confidence level of a number of confidence levels, each confidence level representing a percentage of the future energy outputs in the corresponding histogram, where each of the future energy outputs within the percentage has a same or a greater value than the energy level being derived for the corresponding confidence level;

assigning predetermined uses to energy amounts according to each energy level in each time interval, wherein an energy amount according to each energy level represents the energy between each energy level and a next lower energy level, respectively, within the respective time interval; and reducing, based on the confidence level and the predetermined use associated with the respective time interval, the energy output of the power generation plant by the respective energy amount for the respective time interval, wherein the energy output of the power generation plant is reduced by controlling operation of a wind turbine or a solar panel at the power generation plant.

16. The method of claim 2, wherein the plurality of neural networks comprises time delay recurrent neural networks unfolded in time.

17. The method of claim 1, wherein the power generation plant is a renewable power generation plant.

18. The method of claim 6, wherein the data comprises weather data at a plurality of positions in the environment of the power generation plant, geographic data concerning a location of the power generation plant, or a combination thereof.

19. The method of claim 7, wherein the data is weather data.

20. The non-transitory computer-readable storage medium of claim 15, wherein the plurality of neural networks comprises one or more recurrent neural networks, one or more feed forward networks, one or more networks embedding at least one feed forward network into at least one recurrent neural network, or any combination thereof.

21. The method of claim 1, wherein controlling operation of the wind turbine comprises reducing a rotational speed of the wind turbine.

* * * * *